United States Patent
Koh et al.

(10) Patent No.: US 10,892,742 B2
(45) Date of Patent: Jan. 12, 2021

(54) DUTY-CYCLE CALIBRATION BASED ON DIFFERENTIAL CLOCK SENSING

(71) Applicant: Texas Instruments Incorporated, Dallas, TX (US)

(72) Inventors: Yongseon Koh, Palo Alto, CA (US); Roland Ribeiro, San Jose, CA (US); Horia Giuroiu, Campbell, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/723,508

(22) Filed: Dec. 20, 2019

(65) Prior Publication Data

US 2020/0220528 A1 Jul. 9, 2020

Related U.S. Application Data

(60) Provisional application No. 62/789,090, filed on Jan. 7, 2019.

(51) Int. Cl.
*H03K 3/017* (2006.01)
*G06F 1/04* (2006.01)
*H03K 5/156* (2006.01)

(52) U.S. Cl.
CPC ............ *H03K 3/017* (2013.01); *G06F 1/04* (2013.01); *H03K 5/1565* (2013.01)

(58) Field of Classification Search
CPC .......... H03K 3/017; H03K 3/284; H03K 5/01; H03K 5/04; H03K 5/05; H03K 5/06; H03K 5/07; H03K 7/08; G06F 1/04; G06F 1/06; G06F 1/08; G06F 1/10
See application file for complete search history.

(56) References Cited

U.S. PATENT DOCUMENTS 9,270,256 B2 * 2/2016 Lee .................. H03K 3/017
2019/0280682 A1 * 9/2019 Lee .................. H03K 5/1565

OTHER PUBLICATIONS

Zaki, et al. "Design of a Quadrature Clock Conditioning Circuit in 90-nm CMOS Technology," Institute of Electrical and Optical Communication Engineering, University of Stuttgart, Germany, copyright 2008 IEEE (4 pages).

* cited by examiner

*Primary Examiner* — Long Nguyen
(74) *Attorney, Agent, or Firm* — John R. Pessetto; Charles A. Brill; Frank D. Cimino

(57) ABSTRACT

A system includes a pseudo-differential clock path configured to convey a first clock signal and a second clock signal, wherein the second clock signal is inverted relative to the first clock signal. The system also includes a sensing circuit coupled to sensing nodes of the pseudo-differential clock path. The sensing circuit is configured to provide a sense signal based on a comparison of the first clock signal and the second clock signal at the sensing nodes. The system also includes a correction circuit coupled to the sensing circuit and to adjustment nodes of the pseudo-differential clock path. The correction circuit is configured to adjust the first clock signal and the second clock signal using digital-to-analog converters (DACs) and the sense signal.

15 Claims, 5 Drawing Sheets

DUTY-CYCLE CALIBRATION BASED ON DIFFERENTIAL CLOCK SENSING

This application claims priority to U.S. Provisional Application No. 62/789,090, filed Jan. 7, 2019, which is hereby incorporated by reference.

BACKGROUND

In data communication links, the duty-cycle distortion of a clock typically limits the maximum operable frequency of a sampled system, especially in sub-rate high-speed data communication links. To address duty-cycle distortion and thus increase the maximum operable frequency of a sampled system, duty-cycle calibration techniques are needed. One example clock that suffers from duty-cycle distortion is a pseudo-differential clock.

One way to calibrate the duty-cycle of a pseudo-differential clock involves sensing the duty-cycle of the pseudo-differential clock signal by low-pass filtering and comparing the filtered result to a reference corresponding to a 50% duty-cycle, which is usually zero. Since the typical power supply is from a positive potential to ground, both the low-pass filtered clock and the reference should be level-shifted to an acceptable potential that the comparator can compare. Inaccuracies in the power supply result in duty-cycle calibration inaccuracies.

Another way to calibrate the duty-cycle of a pseudo-differential is to sense the duty-cycle of the two complementary single-ended clocks by low-pass filtering and to compare to an expected reference corresponding to the 50% duty-cycle, which is usually the common-mode voltage of the two complementary pseudo-differential clocks. In this situation, detection and correction of the clock with positive and negative polarity must happen twice in sequence when the detection circuit is shared. The reference which corresponds to a 50% duty-cycle can be generated from bandgap, which is the most stable voltage reference in the system. However, the single-ended signal may not be symmetric with respect to the common mode due to process, voltage, and temperature (PVT) variations. That is, the clock is neither an ideal sinusoidal wave nor an ideal pulse, resulting in duty-cycle calibration inaccuracies.

SUMMARY

In accordance with at least one example of the disclosure, a system includes a pseudo-differential clock path configured to convey a first clock signal and a second clock signal, wherein the second clock signal is inverted relative to the first clock signal. The system also includes a sensing circuit coupled to sensing nodes of the pseudo-differential clock path, wherein the sensing circuit is configured to provide a sense signal based on a comparison of the first clock signal and the second clock signal at the sensing nodes. The system also includes a correction circuit coupled to the sensing circuit and to adjustment nodes of the pseudo-differential clock path, wherein the correction circuit is configured to adjust the first clock signal and the second clock signal based on digital-to-analog converters (DACs) and the sense signal.

In accordance with at least one example of the disclosure, a duty-cycle calibration circuit for a pseudo-differential clock signal comprises a differential sensing circuit configured to provide a sense signal based on a comparison of a first clock signal and a second clock signal, wherein the second clock signal is inverted relative to the first clock signal. The duty-cycle calibration circuit also comprises a correction circuit coupled to the differential sensing circuit. The correction circuit comprises DACs and current bleeder circuitry coupled to the DACs.

In accordance with at least one example of the disclosure, a method comprises generating, by a sensing circuit, a sense signal based on a comparison of a first clock signal and a second clock signal, wherein the second clock signal is inverted relative to the first clock signal. The method also comprises generating, by a control circuit, control signals based on the sense signal, wherein generating the control signals involves DACs. The method also comprises adjusting, by a correction circuit, the first clock signal and the second clock signal based on the control signals.

BRIEF DESCRIPTION OF THE DRAWINGS

For a detailed description of various examples, reference will now be made to the accompanying drawings in which.

DETAILED DESCRIPTION

Figure 1:
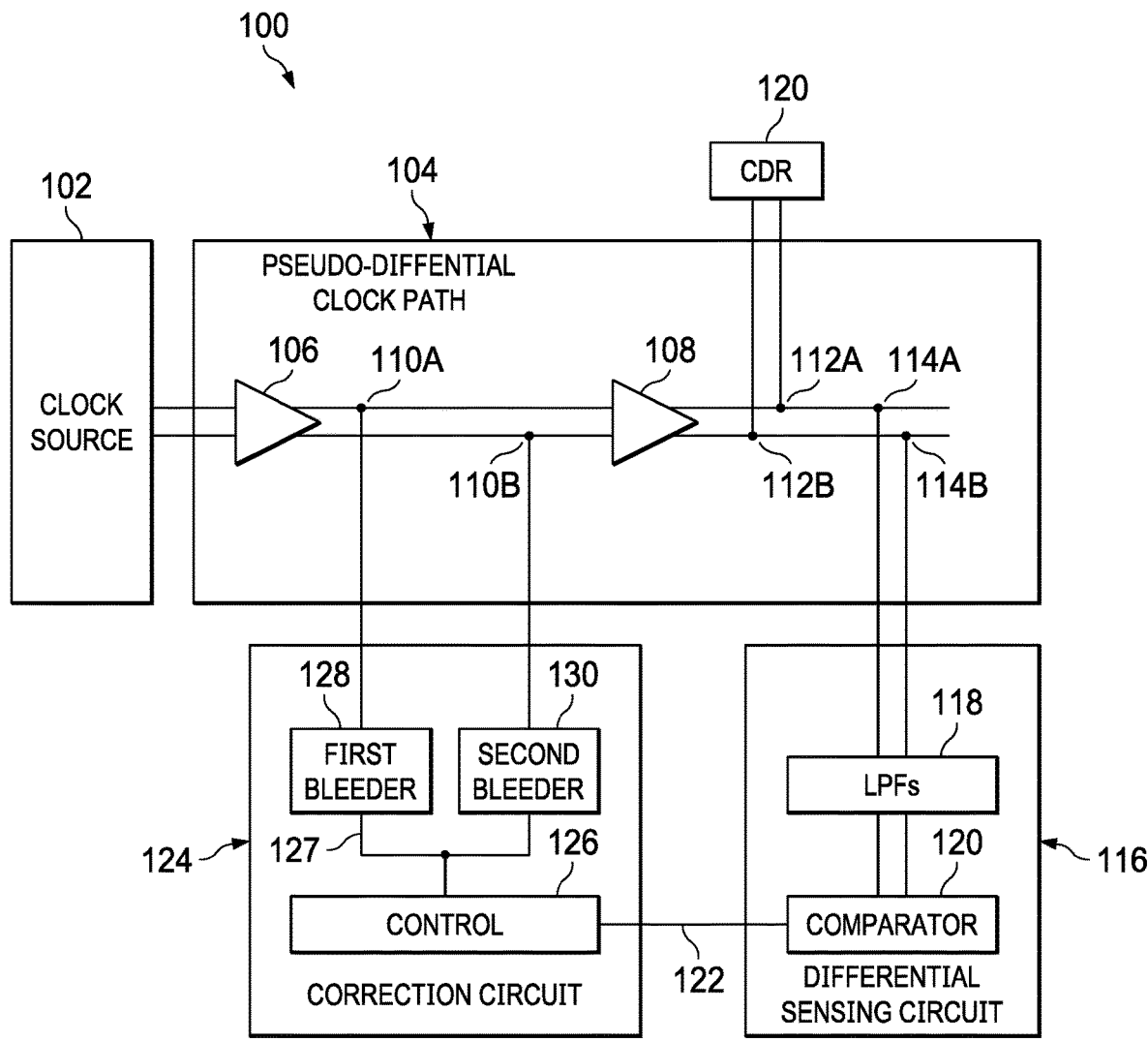
FIG. 1 is a block diagram showing a system in accordance with some examples.

Disclosed herein are differential sensing circuit and correction circuit options to calibrate duty-cycle distortion in a data communication link system or device. In some examples, a differential sensing circuit and a correction circuit are part of a serializer/deserializer integrated circuit (IC) or other commercialized data communication link device with a differential or pseudo-differential clock path. In one example, an electrical system includes a pseudo-differential clock path configured to convey a first clock signal and a second clock signal, where the second clock signal is inverted relative to the first clock signal. The electrical system also includes a sensing circuit coupled to sensing nodes of the pseudo-differential clock path, where the sensing circuit is configured to provide a sense signal based on a comparison of the first clock signal and the second clock signal available at the sensing nodes. The electrical system also includes a correction circuit coupled to the sensing circuit and to adjustment nodes of the pseudo-differential clock path, where the correction circuit is configured to adjust the first clock signal and the second clock using digital-to-analog converters (DACs) and the sense signal.

In some examples, the sensing circuit includes a first low-pass filter configured to filter the first clock signal. The sensing circuit also includes a second low-pass filter configured to filter the second clock signal. The sensing circuit also includes a comparator configured to compare an output of the first low-pass filter and an output of the second low-pass filter. In some examples, the correction circuit includes a control circuit coupled to an output of the comparator, where the control circuit is configured to generate control signals based on the output of the comparator. The correction circuit also includes a first current bleeder circuit coupled to the control circuit and configured to slow down a falling edge of the first clock signal and to slow down a rising edge of the second clock signal based on the control signals. The correction circuit also includes a second current bleeder circuit coupled to the control circuit and configured to slow down a rising edge of the first clock signal and to slow down a falling edge of the second clock signal based on the control signals.

When the clock signal is pseudo-differential CMOS, the proposed differential sensing circuit and correction circuit options are efficient, both in calibration time and hardware sharing, compared to other duty-cycle calibration techniques. Thus, the duty-cycle distortion can be corrected in half the time, while sharing the hardware resources efficiently. With improved duty-cycle calibration, the sensitivity of skew sensing is improved, such that skew sensing to determine the skew between quadrature clocks can be extended to other multiphase clock systems. In some examples, duty-cycle clocks that are calibrated as described herein are used for skew sensing. Once the skew is accurately determined, the skew can be corrected using a skew correction circuit such as digitally controlled delay line or phase interpolator. To provide a better understanding, various differential sensing circuit options, correction circuit options, and related circuits and systems are described using the figures as follows.

FIG. 1 is a block diagram showing a system 100 in accordance with some examples. The system 100 is representative of a data communication link system or device. In some examples, the system 100 corresponds to a serializer/deserializer IC or device. In other examples, the system 100 corresponds to a differential phase interpolator IC or device, or a sub-rate data sampler and driver IC or device.

As shown, the system 100 includes a pseudo-differential clock path 104 with buffer circuits 106 and 108. The system 100 also includes a clock source 102 coupled to the buffer circuit 106, where the clock source 102 is configured to provide pseudo-differential clock signals to the pseudo-differential clock path 104. In other examples, the system 100 includes differential clock path instead of the pseudo-differential clock path 104, and the clock source 102 provides differential clock signals instead of pseudo-differential clock signals. Single-ended signals and fully differential signals herein refers to signals with different reference voltages. More specifically, a single-ended signal is referenced to ground, while a fully-differential signal is referenced to some other voltage common to both polarities. Thus, a pseudodifferential clock signal refers to a pair of single-ended clock signals referenced to ground and with opposite phases.

In the example of FIG. 1, the pseudo-differential clock path 104 includes adjustment nodes 110A and 110B coupled to the output of a correction circuit 124. As shown, the adjustment nodes 110A and 110B are between the buffer circuits 106 and 108. The pseudo-differential clock path 104 also includes output nodes 112A and 112B after the buffer circuit 108, where the output node 112A is electrically equivalent to the sensing node 114A, and wherein the output node 112B is electrically equivalent to the sensing node 114B. As shown, a clock and data recover (CDR) circuit 120 is coupled to the output nodes 112A and 112B, and receives pseudo-differential clock signals that have been corrected by the correction circuit 124. In some examples, the CDR circuit 120 is based on half-rate data sampling.

To correct the pseudo-differential clock signals output to the CDR circuit 120, a differential sensing circuit 116 is coupled to the sensing nodes 114A and 114B of the pseudo-differential clock path 104. As shown, the sensing nodes 114A and 114B are separated from the adjustment nodes 110A and 110B.

In some examples, the pseudo-differential clock path 104 is configured to convey a first clock signal and a second clock signal (from the clock source 102), where the second clock signal is inverted relative to the first clock signal. The differential sensing circuit 116 is configured to provide a sense signal 122 based on a comparison of the first clock signal and the second clock signal available at the sensing nodes 114A and 114B. In some examples, the differential sensing circuit 116 includes low-pass filters (LPFs) 118 configured to filter the first and second clock signals. The differential sensing circuit 116 also includes a comparator 120 configured to compare an output of the LPFs 118, and provide the sense signal 122.

In some examples, the correction circuit 124 includes a control circuit 126 coupled to an output (e.g., the sense signal 122) of the comparator 120, where the control circuit 126 is configured to generate control signals 127 using DACs (e.g., DACs 252 and 256 in FIG. 2B) and the sense signal 122 output from the comparator 120. The correction circuit 124 also includes a first current bleeder circuit 128 coupled to the control circuit 126 and to the adjustment nodes 110A and 110B, where the first current bleeder circuit 128 is configured to slow down either a falling edge or a rising edge of the first clock signal based on the control signals 127. In some examples, the first bleeder circuit 128 is used to slow down the falling edge when the sense signal 122 (based on the filtered first clock signal minus the filtered second clock signal) and thus the control signals 127 indicate that the duty-cycle is less than a target (e.g., 50%). In some other examples, the first bleeder circuit 128 is used to slow down the rising edge when the sense signal 122 and thus the control signals 127 indicate that the duty-cycle is larger than a target (e.g., 50%).

The correction circuit 124 also includes a second current bleeder circuit 130 coupled to the control circuit 126 and to the adjustment nodes 110A and 110B, where the second current bleeder circuit 130 is configured to slow down a rising edge or a falling edge of the second clock signal based on the control signals 127. In some examples, the second bleeder circuit 130 is used when the sense signal 122 (based on the filtered first clock signal minus the filtered second clock signal) and thus the control signals 127 indicate that the duty-cycle is more than a target (e.g., 50%). In some other examples, the first bleeder circuit 128 is used to slow down the rising edge of the first clock signal when the sense signal 122 and thus the control signals 127 indicate that the duty-cycle is less than a target (e.g., 50%).

Figure 2A:
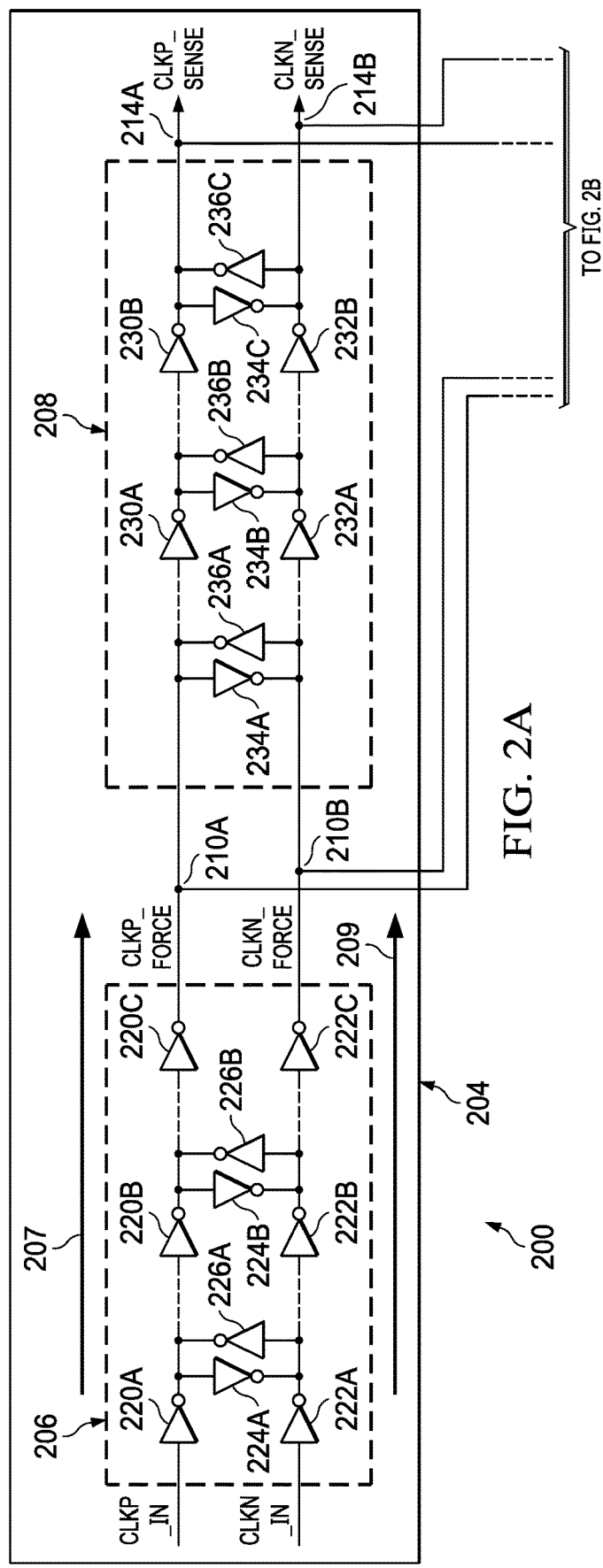
FIGS. 2A and 2B are a diagram showing a differential sensing circuit and a correction circuit for a pseudo-differential clock path in accordance with some examples.
Figure 2B:
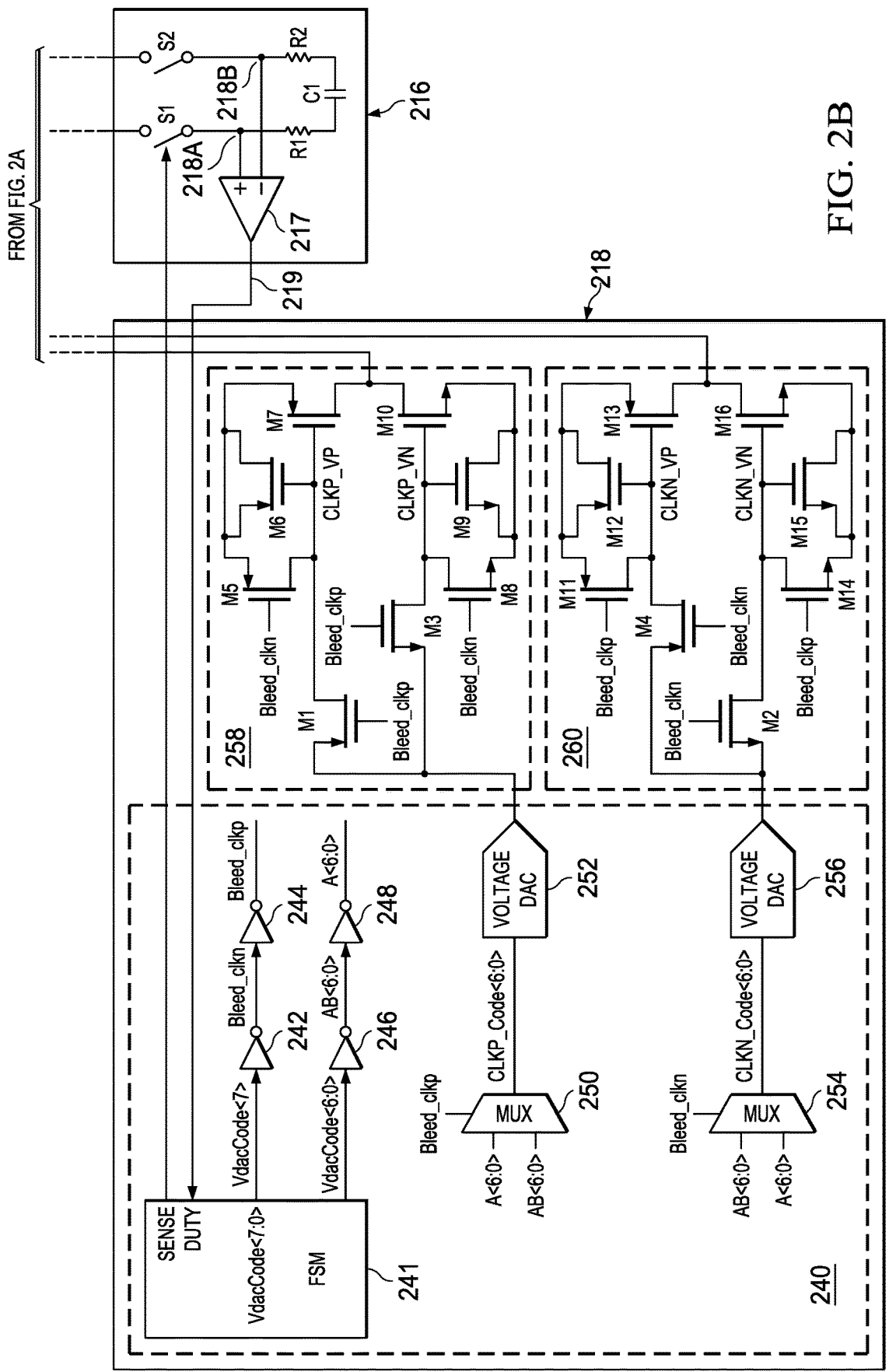

FIGS. 2A and 2B is a diagram 200 showing a differential sensing circuit 216 (an example of the differential sensing circuit 116 in FIG. 1) and a correction circuit 218 (an example of the correction circuit 124 in FIG. 1) for a pseudo-differential clock path 204 (an example of the pseudo-differential clock path 104 in FIG. 1) in accordance with some examples. In the diagram 200, the pseudo-differential clock path 204 includes a first buffer circuit 206 (an example of the buffer circuit 106 in FIG. 1) and a second buffer circuit 208 (an example of the buffer circuit 108 in FIG. 1). The pseudo-differential clock path 204 also includes adjustment nodes 210A and 210B (an example of the adjustment nodes 110A and 110B) between the first and second buffer circuits 206 and 208. After the second buffer circuit 208 or as part of the second buffer circuit 208, the pseudo-differential clock path 204 includes sensing nodes 214A and 214B (an example of the sensing nodes 114A and 114B in FIG. 1).

In the example of FIGS. 2A and 2B, the first buffer circuit 206 includes various inverters 220A-220C, 222A-222C, 224A-224B, and 226A-226B. As shown, the inverters 220A-220C are positioned along a first clock signal (CLKP) path 207, and the inverters 222A-222C are positioned along a second clock signal (CLKN) path 209. Meanwhile, the inverters 224A-224B extend from the CLKP path 207 to the CLKN path 209. Also, the inverters 226A-226B extend from the CLKN path 209 to the CLKP path 207. In different examples, the number and arrangement of components in the first buffer circuit 206 vary.

The second buffer circuit 208 includes various inverters 230A-230, 232A-232, 234A-234C, and 236A-236C. As shown, the inverters 230A-230B are positioned along the CLKP path 207, and the inverters 232A-232B are positioned along the CLKN path 209. Meanwhile, the inverters 234A-234C extend from the CLKP path 207 to the CLKN path 209. Also, the inverters 236A-236C extend from the CLKN path 209 to the CLKP path 207. In different examples, the number and arrangement of components in the second buffer circuit 208 vary.

In some examples, the adjustment nodes 210A and 210B of the pseudo-differential clock path 204 are coupled to another circuit (e.g., a CDR circuit as in FIG. 1), where the adjustment nodes 210A and 210B provides CLKP and CLKN signals with calibrated duty-cycles based on the operations of the correction circuit 218. To calibrate the CLKP and CLKN signals, the correction circuit 218 uses a sense signal 219 (an example of the sense signal 122 in FIG. 1) from the differential sensing circuit 216, which is coupled to the sensing nodes 214A and 214B of the pseudo-differential clock path 204. As shown, the sensing nodes 214A and 214B are separated from the adjustment nodes 210A and 210B by at least some components of the second buffer circuit 208.

In some examples, the pseudo-differential clock path 204 is configured to convey CLKP and CLKN from a clock source (e.g., the clock source 102 in FIG. 1), where CLKN is inverted relative to CLKP. The differential sensing circuit 216 is configured to provide the sense signal 219 based on a comparison of CLKP and CLKN available at the sensing nodes 214A and 214B. In some examples, the differential sensing circuit 216 includes LPF components such as resistors (e.g., R1 and R2 in FIG. 2B) and a capacitor (e.g., C1 in FIG. 2B), which corresponds to the LPFs 118 in FIG. 1. In the example of FIGS. 2A and 2B, C1 is in series between R1 and R2. The differential sensing circuit 216 also includes a comparator 217 (an example of the comparator 117 in FIG. 1), where a first (e.g., positive) input of the comparator 217 is coupled to the sensing node 214A related to CLKP via node 218A and a first switch (S1). Also, a second (e.g., negative) input of the comparator 217 is coupled to the sensing node 214B related to CLKN via node 218B and a second switch (S2).

When S1 and S2 are closed, the inputs to the comparator 217 correspond to filtered values (due to R1, R2, and C1) for CLKP and CLKN that indicate their respective duty-cycles. The comparator 217 is configured to compare the filtered values at nodes 218A and 218B and provide the sense signal 219.

In some examples, the correction circuit 218 includes a control circuit 240 coupled to an output (e.g., sense signal 219) of the comparator 217. As shown, the control circuit 240 includes programmable logic 241 (e.g., a finite state machine (FSM) or other programmable logic) configured to provide switch control signals to close S1 and S2 to enable sensing operations, or to open S1 and S2 to disable sensing operations.

In some examples, the programmable logic 241 provides the switch control signals according to an adjustment schedule, where each adjustment takes $5\tau$, and where $\tau=RC$. The step response of an RC filter is $V=V_0(1-e^{-t/\tau})$, where $V_0$ is the steady state value. At $t=5\tau$, V reaches 99% of $V_0$. In some examples, $5\tau$ is equivalent to four clock cycles, and thus the programmable logic 241 is updated at every fourth clock as in the flowchart of FIG. 4. However, it should be appreciated that the number of clock cycles varies depending on the clock rate used. More generically, the adjustment schedule for the programmable logic 241 is based on a calibration clock, where the number of clock cycles corresponding to an adjustment target (e.g., $5\tau$) depends on the clock rate of the calibration clock.

Besides providing the switch control signals, the control circuit 240 also provides calibration control signals based on the sense signal 219. In the example of FIGS. 2A and 2B, the calibration control signals corresponds to a digital signal (VdacCode<7:0>), where the first bit (VdacCode<7>) of the digital signal corresponds to a first control signal, and where remaining bits (VdacCode<6:0>) of the digital signal corresponds to a second control signal.

As shown, the first control signal is provided to a first inverter 242 to generate a first gate drive signal (Bleed_clkn). The output of the first inverter 242 is provided to a second inverter 244 to generate a second gate drive signal (Bleed_clkp). Also, the second control signal is provided to a third inverter 246 to generate a first digital-to-analog converter (DAC) input signal (AB<6:0>). The output of the third inverter 246 is provided to a fourth inverter 248 to generate a second DAC input signal (A<6:0>). In the example of FIGS. 2A and 2B, the various inverters 242, 244, 246, and 248 are part of the control circuit 240.

As shown, the control circuit 240 also includes a first multiplexer 250 that receives the first and second DAC input signals as inputs, and where the second gate drive signal (Bleed_clkp) is the control signal for the first multiplexer 250. Thus, if the second gate drive signal is "0", the first DAC input signal (AB<6:0>) is output from the first multiplexer 250, whereas if the first gate drive signal is "1", the second DAC input signal (A<6:0>) is output from the first multiplexer 250. The output of the first multiplexer 250 is a CLKP control signal (CLKP_Code<6:0>) provided to a first DAC 252, which converts the CLKP control signal to a voltage value.

As shown, the control circuit 240 also includes a second multiplexer 254 that receives the first and second DAC input signals as inputs, and where the first gate drive signal (Bleed_clkn) is the control signal for the second multiplexer 254. Thus, if the first gate drive signal is "0", the second DAC input signal (A<6:0>) is output from the second multiplexer 254, whereas if the second gate drive signal is "1", the first DAC input signal (AB<6:0>) is output from the second multiplexer 254. The output of the second multiplexer 254 is a CLKN control signal (CLKN_Code<6:0>) provided to a second DAC 256, which converts the CLKN control signal to a voltage value.

In the example of FIGS. 2A and 2B, the correction circuit 218 also includes a first bleeder circuit 258 (an example of at least part the first bleeder circuit 128 in FIG. 1) and a second bleeder circuit 260 (an example of at least part of the second bleed circuit 130 in FIG. 1) coupled to the control circuit 240. The first current bleeder circuit 258 is configured to adjust CLKP, and the second current bleeder circuit 260 is configured to adjust CLKN. More specifically, the first current bleeder circuit 258 is configured increase the duty-cycle of CLKP by slowing down a falling edge of CLKP when the sense signal 219 (based on the filtered first clock signal minus the filtered second clock signal) indicates that the duty-cycle is less than a target (e.g., 50%). Alternatively, the first current bleeder circuit 258 is configured to decrease the duty-cycle of CLKP by slowing down a rising edge of CLKP when the sense signal 219 indicates that the duty-cycle is more than a target (e.g., 50%).

As shown, the first current bleeder circuit 258 includes an arrangement of transistors M1, M3, and M5-M10 to perform the CLKP adjustments, where M1 and M3 are controlled by Bleed_clkp, M5 and M8 are controlled by Bleed_clkn, M6 and M7 are controlled by CLKP_VP, and M9 and M10 are controlled by CLKP_VN. More specifically, when M1 is turned on based on Bleep_clkp being low, the duty-cycle of CLKP is increased by slowing down a falling edge of CLKP. Alternatively, when M3 is turned on based on Bleed_clkp being high, the duty-cycle of CLKP is decreased by slowing down a rising edge of CLKP.

Also, the second current bleeder circuit 260 is configured to increase the duty-cycle of CLKN by slowing down a rising edge of CLKN when the sense signal 219 indicates that the duty-cycle is less than a target (e.g., 50%). Alternatively, the second current bleeder circuit 260 is configured to decrease the duty-cycle of CLKN to slow down a falling edge of CLKN when the sense signal 219 indicates that the duty-cycle is more than a target (e.g., 50%).

As shown, the second current bleeder circuit 260 includes an arrangement of transistors M2, M4, and M11-M16 to perform the CLKN adjustments, where M2 and M4 are controlled by Bleed_clkn, M11 and M14 are controlled by Bleed_clkp, M12 and M13 are controlled by CLKN_VP, and M15 and M16 are controlled by CLKN_VN. More specifically, when M2 is turned on based on Bleep_clkp being high, the duty-cycle of CLKN is increased by slowing down a falling edge of CLKN. Alternatively, when M4 is turned on based on Bleed_clkn being low, the duty-cycle of CLKN is decreased by slowing down a rising edge of CLKN.

Figure 3A:
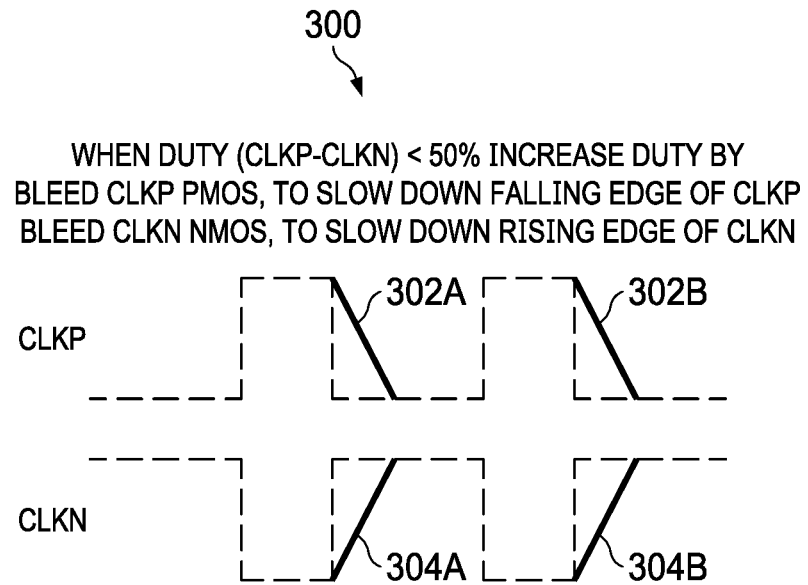
FIGS. 3A and 3B are timing diagrams showing differential clock signal corrections in accordance with some examples.
Figure 3B:
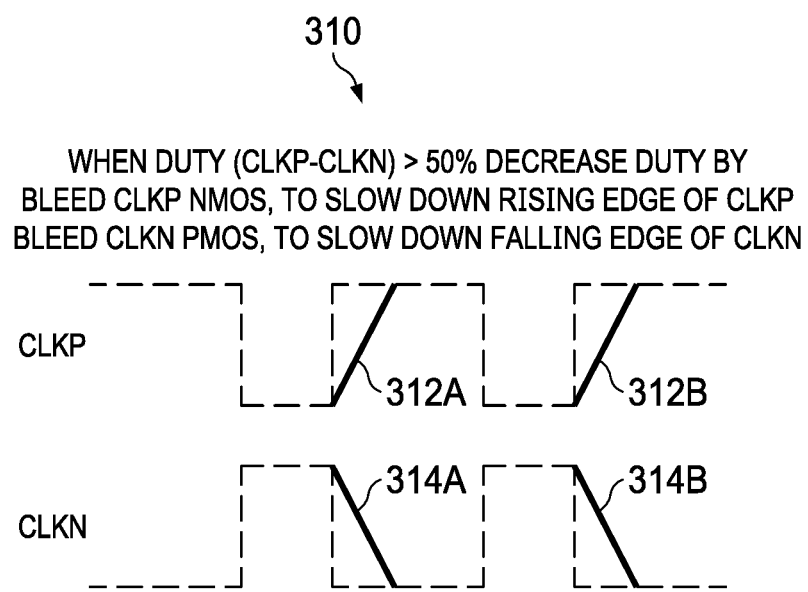

FIGS. 3A and 3B are timing diagrams 300 and 310 showing differential clock signal corrections in accordance with some examples. In the timing diagram 300 of FIG. 3A, CLKP and CLKN are represented, where the falling edges of CLKP and the rising edges of CLKN are slowed down to increase duty-cycle (e.g., in response to detecting that the duty-cycle is below a target such as 50%). In the timing diagram 310 of FIG. 3B, CLKP and CLKN are represented, where the rising edges of CLKP and the falling edges of CLKN are slowed down to decrease duty-cycle (e.g., in response to detecting that the duty-cycle is below a target such as 50%).

Figure 4:
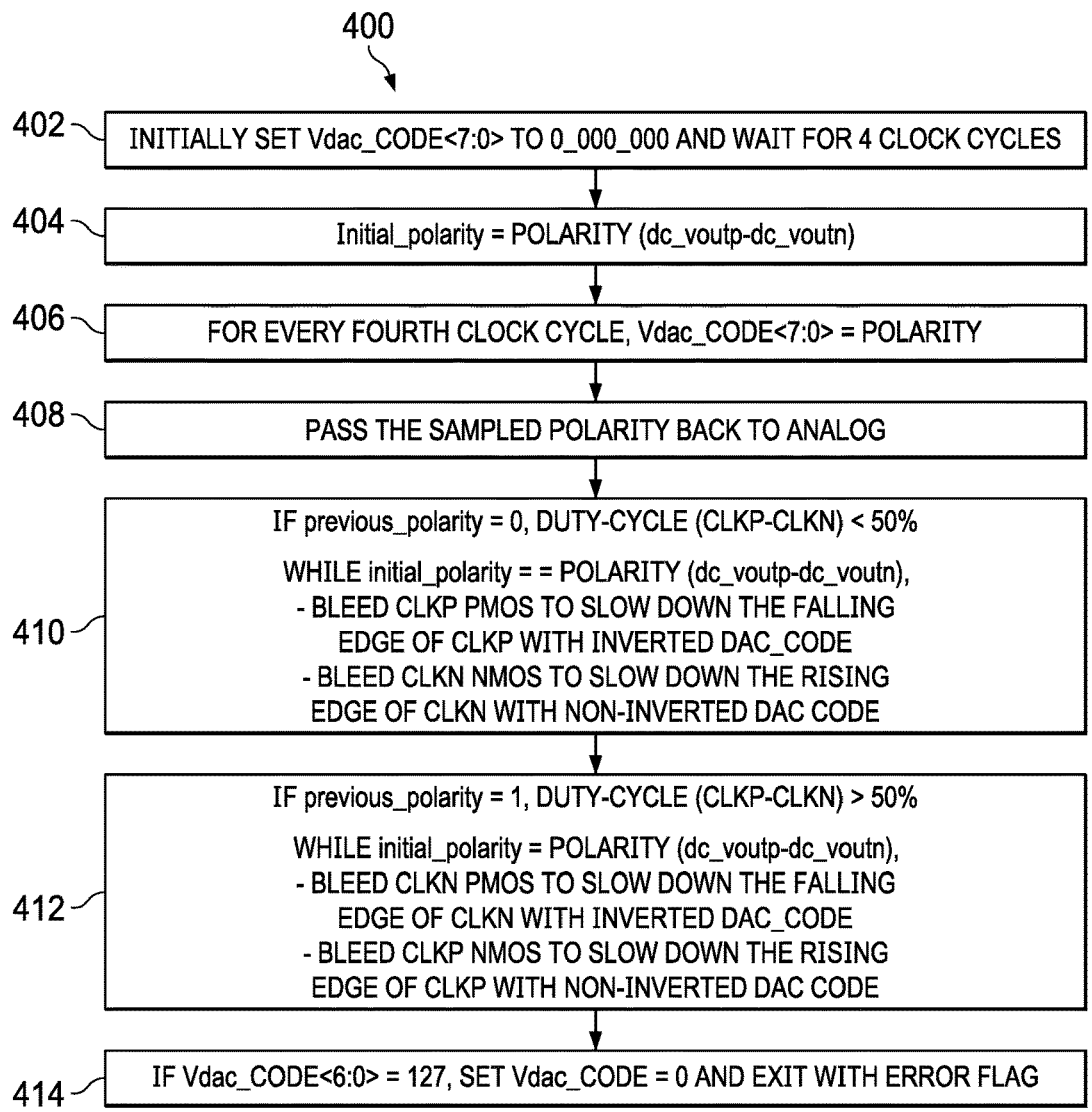
FIG. 4 is a flowchart showing a correction circuit state machine in accordance with some examples.

FIG. 4 is a flowchart showing a correction circuit state machine 400 in accordance with some examples. The correction circuit state machine 400 is performed, for example, by the correction circuit 218 in FIG. 2B. As shown, the correction circuit state machine 400 comprises initially setting Vdac_CODE<7:0> to 0_000_000 and waiting for 4 clock cycles at block 402. At block 404, initial_polarity=polarity (dc_voutp-dc_voutn), where dc_voutp is the duty-cycle of CLKP and dc_voutn is the duty-cycle of CLKN. At block 406, for every $4^{th}$ clock cycle, Vdac_CODE<7>=polarity (i.e., whether the duty-cycle is greater than or less than 50%, where Vdac_CODE<7>=1 signifies a duty-cycle greater than 50% and Vdac_CODE<7>=0 signifies a duty-cycle less than 50%. At block 408, the sampled polarity is passed back to analog (e.g., using the multiplexers 250 and 254, and the DACs 252 and 256). At block 410, if previous_polarity=0, the duty-cycle (CLKP-CLKN)<50% and various operations are performed to increase the duty-cycle. In block 410, while initial_polarity=polarity (dc_voutp-dc_voutn), the CLKP NMOS (e.g., M1 in FIG. 2B) is bled to slow shown the falling edge of CLKP using an inverted DAC_CODE (A<6:0>). Also, the CLKN PMOS (e.g., M2 in FIG. 2B) is bled to slow down the rising edge of CLKN using a non-inverted DAC CODE (AB<6:0>). At block 412, if previous_polarity=1, the duty-cycle (CLKP-CLKN)>50% and various operations are performed to decrease the duty-cycle. In block 412, while initial_polarity=polarity (dc_voutp-dc_voutn), the CLKN NMOS (e.g., M4 in FIG. 2B) is bled to slow down the falling edge of CLKN using an inverted DAC_CODE (A<6:0>). Also, the CLKP PMOS (e.g., M3 in FIG. 2B) is bled to slow down the rising edge of CLKP using a non-inverted DAC_CODE (AB<6:0>). At block 414, if Vdac_CODE<6:0>=127, set Vdac_CODE=0 and exit with error flag.

Figure 5:
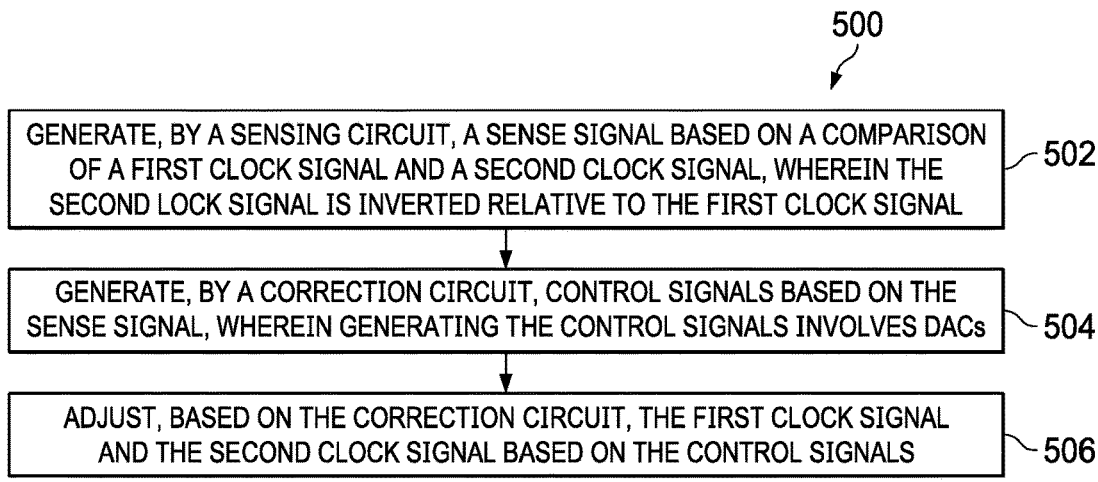
FIG. 5 is a flowchart showing a method in accordance with some examples.

FIG. 5 is a flowchart showing a method 500 in accordance with some examples. As shown, the method 500 comprises generating, by a sensing circuit (e.g., the differential sensing circuit 216 in FIG. 2B), a sense signal (e.g., the sense signal 219 in FIG. 2B) based on a comparison of a first clock signal (CLKP, FIGS. 3A, 3B) and a second clock signal (CLKN, FIGS. 3A, 3B), wherein the second clock signal is inverted relative to the first clock signal at block 502. At block 504, control signals (e.g., VdacCode<7>, VdacCode<6:0>, Bleed_clkn, Bleed_clkp, AB<6:0>, A<6:0>, and the outputs of DACs 252 and 256 in FIG. 2B) are generated, by a correction circuit, based on the sense signal. In some examples, generating the control signals at block 504 involves DACs (e.g., the DACs 252, 256 in FIG. 2B). At block 506, the first clock signal and the second clock signal are adjusted, by the correction circuit, based on the control signals.

In some examples, generating the sense signal at block 502 includes: low-pass filtering the first clock signal to provide first filtered output; low-pass filtering the second clock signal to provide a second filtered output; and comparing, by a comparator, the first and second filtered outputs to generate the sense signal. In some examples, generating control signals based on the sense signal at block 504 comprises receiving, by a digital controller, the sense signal. Generating the control signals based on the sense signal at block 504 also includes: outputting, by the digital controller, a first digital signal to a first inverter; inverting, by a second inverter, an output of the first inverter; outputting, by the digital controller, a second digital signal to a third inverter; and inverting, by a fourth inverter, an output of the third inverter. In some examples, the control signals include a first control signal corresponding to an output of the first inverter, a second control signal corresponding to an output of the second inverter, a third control signal corresponding to an output of the third inverter, and a fourth control signal corresponding to an output of the fourth inverter.

In some examples, adjusting the first clock signal and the second clock signal based on the control signals at block 506 includes: slowing down a falling edge of the first clock signal based on the second, third, and fourth control signals; and slowing down a rising edge of the second clock signal based on the second, third, and fourth control signals. In some examples, adjusting the first clock signal and the second clock signal based on the control signals includes: slowing down a rising edge of the first clock signal based on the second, third, and fourth control signals; and slowing down a falling edge of the second clock signal based on the second, third, and fourth control signals.

In some examples, the sensing circuit used for the method 500 includes: a first low-pass filter configured to filter the first clock signal; a second low-pass filter configured to filter the second clock signal; and a comparator configured to compare an output of the first low-pass filter and an output of the second low-pass filter (see e.g., the differential sensing circuit 116 of FIG. 1, or the differential sensing circuit 216 of FIG. 2B). In some examples, the correction circuit used for the method 500 includes a control circuit (e.g., the control circuit 126 in FIG. 1, or the control coupled to an output of the comparator of the sensing circuit, where the control circuit 240 in FIG. 2B) is configured to generate control signals (e.g., VdacCode<7>, VdacCode<6:0>, Bleed_clkn, Bleed_clkp, AB<6:0>, A<6:0>, and the outputs of DACs 252 and 256 in FIG. 2B) based on the output of the comparator (see e.g., the correction circuit 124 in FIG. 1, or the correction circuit 218 in FIG. 2B). In some examples, the control circuit includes: a first current bleeder circuit coupled to the control circuit and configured to adjust the first clock signal based on at least some of the control signals; and a second current bleeder circuit coupled to the control circuit and configured to adjust the second clock signal based on at least some of the control signals. In some examples, the control circuit includes: a finite state machine (e.g., the programmable logic 241 in FIG. 2B) coupled to an output of the comparator of the sensing circuit; a first inverter (e.g., the first inverter 242 in FIG. 2B) coupled to a first output node of the finite state machine; a second inverter (e.g., the second inverter 244 in FIG. 2B) coupled to an output of the first inverter; a third inverter (e.g., the third inverter 246 in FIG. 2B) coupled to a second output node of the finite state machine; and a fourth inverter (e.g., the fourth inverter 248 in FIG. 2B) coupled to an output of the third inverter.

In some examples, the control circuit also includes a first multiplexer (e.g., the first multiplexer 250 in FIG. 2B) having: a first input coupled to an output of the third inverter; a second input coupled to an output of the fourth inverter; and a control node coupled to an output of the second inverter. In some examples, the control circuit also includes a first DAC (e.g., the first DAC 252 in FIG. 2B) coupled to an output of the first multiplexer. In some examples, the control circuit also includes a second multiplexer (e.g., the second multiplexer 254 in FIG. 2B) having: a first input coupled to an output of the fourth inverter; a second input coupled to an output of the third inverter; and a control node coupled to an output of the first inverter. In some examples, the control circuit also includes a second DAC (e.g., the second DAC 256 in FIG. 2B) coupled to an output of the second multiplexer.

In some examples, the first current bleeder circuit includes a first transistor (e.g., M1 in FIG. 2B) having: a first current terminal coupled to an output of the first DAC; a second current terminal coupled to a control terminal of a second transistor (e.g., M7 in FIG. 2B); and a control terminal coupled to an output of the second inverter. The first current bleeder circuit also includes a third transistor (e.g., M3 in FIG. 2B) having: a first current terminal coupled to an output of the first DAC; a second current terminal coupled to a control terminal of a fourth transistor (e.g., M10 in FIG. 2B); and a control terminal coupled to an output of the second inverter.

In some examples, the second current bleeder circuit includes a fifth transistor (e.g., M4 in FIG. 2B) having: a first current terminal coupled to an output of the second DAC; a second current terminal coupled to a control terminal of a sixth transistor (e.g., M13 in FIG. 2B); and a control terminal coupled to an output of the first inverter. In some examples, the second current bleeder circuit also includes a seventh transistor (e.g., M2 in FIG. 2B) having: a first current terminal coupled to an output of the second DAC; a second current terminal coupled to a control terminal of an eighth transistor (e.g., M16 in FIG. 2B); and a control terminal coupled to an output of the first inverter.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A system, comprising:
    a pseudo-differential clock path configured to convey a first clock signal and a second clock signal, wherein the second clock signal is inverted relative to the first clock signal;
    a sensing circuit coupled to sensing nodes of the pseudo-differential clock path, wherein the sensing circuit is configured to provide a sense signal based on a comparison of the first clock signal and the second clock signal at the sensing nodes; and
    a correction circuit coupled to the sensing circuit and to adjustment nodes of the pseudo-differential clock path, wherein the correction circuit is configured to adjust the first clock signal and the second clock signal using digital-to-analog converters (DACs) and the sense signal;
    wherein the sensing circuit comprises:
    a first low-pass filter configured to filter the first clock signal;
    a second low-pass filter configured to filter the second clock signal; and
    a comparator configured to compare an output of the first low-pass filter and an output of the second low-pass filter.

2. The system of claim 1, wherein the correction circuit comprises a control circuit configured to generate different control signals based on the output of the comparator, and wherein the control circuit comprises:
    a first DAC of the DACs;
    a first current bleeder circuit coupled to the first DAC and configured to adjust the first clock signal based on at least some of the different control signals;
    a second DAC of the DACs; and
    a second current bleeder circuit coupled to the second DAC and configured to adjust the second clock signal based on at least some of the different control signals.

3. The system of claim 2, wherein the control circuit comprises:
    a finite state machine coupled to an output of the comparator;
    a first inverter coupled to a first output node of the finite state machine;
    a second inverter coupled to an output of the first inverter;
    a third inverter coupled to a second output node of the finite state machine; and
    a fourth inverter coupled to an output of the third inverter.

4. The system of claim 3, wherein the control circuit further comprises:
a first multiplexer having:
a first input coupled to an output of the third inverter;
a second input coupled to an output of the fourth inverter; and
a control node coupled to an output of the second inverter, wherein the first DAC is coupled to an output of the first multiplexer;
a second multiplexer having:
a first input coupled to an output of the fourth inverter;
a second input coupled to an output of the third inverter; and
a control node coupled to an output of the first inverter, wherein the second DAC is coupled to an output of the second multiplexer.

5. The system of claim 4, wherein the first current bleeder circuit comprises:
a first transistor having:
a first current terminal coupled to an output of the first DAC;
a second current terminal coupled to a control terminal of a second transistor; and
a control terminal coupled to an output of the second inverter; and
a third transistor having:
a first current terminal coupled to an output of the first DAC;
a second current terminal coupled to a control terminal of a fourth transistor; and
a control terminal coupled to an output of the second inverter.

6. The system of claim 5, wherein the second current bleeder circuit comprises:
a fifth transistor having:
a first current terminal coupled to an output of the second DAC;
a second current terminal coupled to a control terminal of a sixth transistor; and
a control terminal coupled to an output of the first inverter; and
a seventh transistor having:
a first current terminal coupled to an output of the second DAC;
a second current terminal coupled to a control terminal of an eighth transistor; and
a control terminal coupled to an output of the first inverter.

7. A system, comprising:
a pseudo-differential clock path configured to convey a first clock signal and a second clock signal, wherein the second clock signal is inverted relative to the first clock signal;
a sensing circuit coupled to sensing nodes of the pseudo-differential clock path, wherein the sensing circuit is configured to provide a sense signal based on a comparison of the first clock signal and the second clock signal at the sensing nodes;
a correction circuit coupled to the sensing circuit and to adjustment nodes of the pseudo-differential clock path, wherein the correction circuit is configured to adjust the first clock signal and the second clock signal using digital-to-analog converters (DACs) and the sense signal;

and a clock and data recovery (CDR) circuit coupled to the sensing nodes of the pseudo-differential clock path, wherein the CDR circuit is based on half-rate data sampling.

8. A duty-cycle calibration circuit comprising:
a differential sensing circuit configured to provide a sense signal based on a comparison of a first clock signal and a second clock signal; and
a correction circuit coupled to the sensing circuit, wherein the correction circuit comprises:
digital-to-analog converters (DACs); and
current bleeder circuitry coupled to the DACs;
wherein the correction circuit comprises a control circuit coupled to an output of a comparator of the differential sensing circuit, wherein the comparator provides the sense signal,
wherein the control circuit is configured to generate control signals based on the output of the comparator, and wherein the DACs are part of the control circuit,
wherein the current bleeder circuitry is configured to slow down a falling edge of the first clock signal and to slow down a rising edge of the second clock signal based on the control signals indicating a first duty-cycle condition, and
wherein the current bleeder circuitry is configured to slow down a rising edge of the first clock signal and to slow down a falling edge of the second clock signal based on the control signals indicating a second duty-cycle condition;
wherein control circuit comprises:
a finite state machine coupled to an output of the comparator;
a first inverter coupled to a first output node of the finite state machine;
a second inverter coupled to an output of the first inverter;
a third inverter coupled to a second output node of the finite state machine; and
a fourth inverter coupled to an output of the third inverter.

9. The duty-cycle calibration circuit of claim 8, wherein the control circuit further comprises:
a first multiplexer having:
a first input coupled to an output of the third inverter;
a second input coupled to an output of the fourth inverter; and
a control node coupled to an output of the second inverter;
a first DAC of the DACs coupled to an output of the first multiplexer;
a second multiplexer having:
a first input coupled to an output of the fourth inverter;
a second input coupled to an output of the third inverter; and
a control node coupled to an output of the first inverter; and
a second DAC of the DACs coupled to an output of the second multiplexer.

10. The duty-cycle calibration circuit of claim 9, wherein the current bleeder circuitry comprises:
a first transistor having:
a first current terminal coupled to an output of the first DAC;
a second current terminal coupled to a control terminal of a second transistor; and a control terminal coupled to an output of the second inverter; and a third transistor having:
a first current terminal coupled to an output of the first DAC;
a second current terminal coupled to a control terminal of a fourth transistor; and
a control terminal coupled to an output of the second inverter.

11. The duty-cycle calibration circuit of claim 10, wherein the current bleeder circuitry comprises:

a fifth transistor having:
a first current terminal coupled to an output of the second DAC;
a second current terminal coupled to a control terminal of a sixth transistor; and
a control terminal coupled to an output of the first inverter; and a seventh transistor having:
a first current terminal coupled to an output of the second DAC;
a second current terminal coupled to a control terminal of an eighth transistor; and
a control terminal coupled to an output of the first inverter.

12. A method, comprising:
generating, by a sensing circuit, a sense signal based on a comparison of a first clock signal and a second clock signal, wherein the second clock signal is inverted relative to the first clock signal;
generating, by a correction circuit, control signals based on the sense signal, wherein generating the control signals involves digital-to-analog converters (DACs); and
adjusting, by the correction circuit, the first clock signal and the second clock signal based on the control signals;
wherein generating the sense signal comprises:
low-pass filtering the first clock signal to provide a first filtered output;
low-pass filtering the second clock signal to provide a second filtered output; and
comparing, by a comparator, the first and second filtered outputs to generate the sense signal.

13. A method, comprising:
generating, by a sensing circuit, a sense signal based on a comparison of a first clock signal and a second clock signal, wherein the second clock signal is inverted relative to the first clock signal;
generating, by a correction circuit, control signals based on the sense signal, wherein generating the control signals involves digital-to-analog converters (DACs); and
adjusting, by the correction circuit, the first clock signal and the second clock signal based on the control signals;
wherein generating, by the control circuit, control signals based on the sense signal comprises:
receiving, by a digital controller, the sense signal;
outputting, by the digital controller, a first digital signal to a first inverter;
inverting, by a second inverter, an output of the first inverter;
outputting, by the digital controller, a second digital signal to a third inverter; and
inverting, by a fourth inverter, an output of the third inverter,
wherein the control signals include a first control signal corresponding to an output of the first inverter, a second control signal corresponding to an output of the second inverter, a third control signal corresponding to an output of the third inverter, and a fourth control signal corresponding to an output of the fourth inverter.

14. The method of claim 13, wherein adjusting, by the correction circuit, the first clock signal and the second clock signal based on the control signals comprises:
slowing down a falling edge of the first clock signal based on the second, third, and fourth control signals; and
slowing down a rising edge of the second clock signal based on the second, third, and fourth control signals.

15. The method of claim 13, wherein adjusting, by the correction circuit, the first clock signal and the second clock signal based on the control signals comprises:
slowing down a rising edge of the first clock signal based on the second, third, and fourth control signals; and
slowing down a falling edge of the second clock signal based on the second, third, and fourth control signals.

* * * * *